United States Patent
Cline et al.

(10) Patent No.: US 6,400,152 B1
(45) Date of Patent: Jun. 4, 2002

(54) SPIRAL TRAJECTORY CALCULATIONS FOR MRI

(75) Inventors: Harvey Ellis Cline; Xuli Zong, both of Schenectady, NY (US); Neville D. Gai, Hartland, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/494,644

(22) Filed: Jan. 31, 2000

(51) Int. Cl.$^7$ .................................................. G01V 3/00
(52) U.S. Cl. .......................................................... 324/309
(58) Field of Search ................................. 324/309, 300, 324/307, 318

(56) References Cited

U.S. PATENT DOCUMENTS

| | | | |
|---|---|---|---|
| 5,192,909 A | * 3/1993 | Hardy et al. | 324/309 |
| 5,485,086 A | 1/1996 | Meyer et al. | 324/307 |
| 5,652,516 A | 7/1997 | Adalsteinsson et al. | 324/309 |
| 5,892,358 A | 4/1999 | King | 324/309 |
| 6,020,739 A | * 2/2000 | Meyer et al. | 324/309 |
| 6,066,949 A | * 5/2000 | Alley et al. | 324/309 |

OTHER PUBLICATIONS

CH Meyer, BS Hu, DG Nishimura, A Macovski, "Fast Spiral Coronary Artery Imaging", Magnetic Resonance in Medicine, 28, 202–213 (1992).

* cited by examiner

Primary Examiner—Hezron E. Williams
Assistant Examiner—Brij B. Shrivastav
(74) Attorney, Agent, or Firm—Jean K. Testa; Donald S. Ingraham

(57) ABSTRACT

An apparatus and method for Magnetic Resonance Imaging (MRI) by spiral trajectory scanning comprises an MR imaging device for acquiring and processing data samples of an object to be imaged, wherein the data samples are acquired by spiral trajectory scanning. An interface is coupled to the MR imaging device for receiving operator-defined spiral scanning parameters, and a computer is coupled to the interface and the MR imaging device. The computer is configured to generate an approximated spiral trajectory in k-space in accordance with operator-defined spiral scanning parameters. The approximated spiral trajectory is used by the MR imaging system to perform spiral trajectory scanning.

13 Claims, 8 Drawing Sheets

SPIRAL TRAJECTORY CALCULATIONS FOR MRI

BACKGROUND OF THE INVENTION

This invention relates generally to medical imaging. More particularly, this invention relates to spiral scanning for medical imaging.

Medical imaging, for example Magnetic Resonance Imaging (MRI), involves acquiring data in the spatial frequency domain referred to as k-space, and transforming the data into the spatial domain prior to viewing. The k-space is represented by magnitude and phase time data. The Fourier transform of k-space data is the MRI image.

Spiral scanning is a known method in dynamic imaging, for example MRI, that has been used to achieve shorter scan time than can be achieved with conventional MR techniques, such as raster scanning. The method of a spiral imaging sequence, or spiral acquisition, involves acquiring data from k-space in a spiral. In a spiral acquisition, the gradients in the logical X- and Y-axes start from zero, and increase in amplitude in a quasi-periodic fashion. This has the effect of a trajectory that starts from the center of k-space and spirals out to some maximum value. Spiral acquisitions are used in dynamic imaging because they cover k-space more efficiently than the simpler raster methods.

A spiral of constant pitch, also known as an Archimedian spiral, is a known technique for 2D selective excitations limited by both the gradient amplitude and gradient slew rate. The design of spiral acquisitions involves traversing the spiral angle at the ⅔ power of time for constant slew rate and the ½ power of time for constant gradient amplitude. However, near the origin of k-space these analytic relations do not hold. There is a singularity near the origin of k-space, which can be solved by numerical integration of the trajectory differential equations.

The numerical method is computationally demanding and complex which results in longer scan time. The effect of time delays directly affects the patient or subject being diagnosed by the imaging device. Any change of a parameter affecting the gradient waveforms on the imaging device requires that the numerical integration be recalculated, and further requires the patient remain in position in the medical imaging device. What is needed is a computationally less demanding and simpler spiral trajectory calculation that does not compromise the resolution of the resultant medical image. There is a further need to reduce the calculation time for a spiral scanning sequence, thereby reducing the time a patient spends in a medical imaging device.

BRIEF SUMMARY OF THE INVENTION

A computationally efficient method for calculating a spiral scanning trajectory for magnetic resonance imaging (MRI) comprises the steps of placing an object to be imaged in a magnetic field, exciting nuclei in the object to excite desired spectral components for imaging and applying time-varying gradients along two axes in accordance with at least one spiral trajectory in k-space. The method includes generating the spiral trajectory in k-space by analytical approximation. A set of sampling point locations are defined along the spiral trajectory. Data samples are acquired at the sample point locations and processed to construct an image of the object.

An apparatus for MRI by spiral trajectory scanning comprises an MR imaging device for acquiring and processing data samples of an object to be imaged, wherein the data samples are acquired by spiral trajectory scanning. An interface is coupled to the MR imaging device for receiving operator-defined spiral scanning parameters, and a computer is coupled to the interface and the MR imaging device. The computer is configured to generate an approximated spiral trajectory in k-space in accordance with operator-defined spiral scanning parameters. The approximated spiral trajectory is used by the MR imaging system to perform spiral trajectory scanning.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
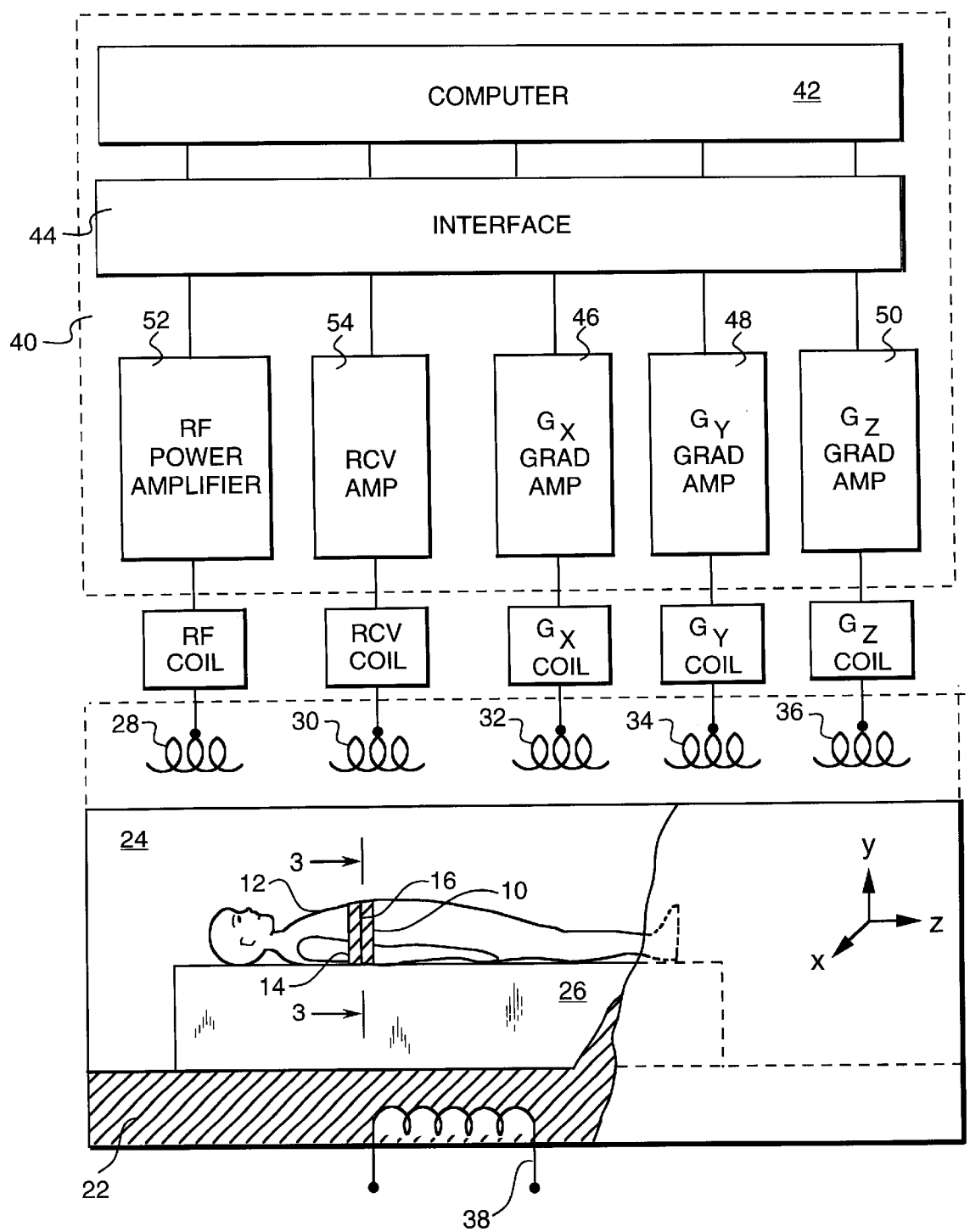
FIG. 1 is a diagram showing components of a Magnetic Resonance Imaging (MRI) system for use in connection with embodiments of the invention.

FIG. 1 shows principal components of an MR imaging system 20, useful for practicing respective embodiments of the invention described hereinafter. System 20 includes a main magnet 22 provided with a bore 24, the MR subject 12 positioned therein on a support 26 for MR imaging of the patient structure 14. MR system 20 further includes a radio frequency (RF) excitation coil 28, a receiver coil 30, $G_x$, $G_y$, and $G_z$ gradient coils 32, 34, and 36, respectively, and a static main magnet coil 38. All of the coils 28 and 32–38 are incorporated into magnet 22 so that when energized, they project respective magnetic fields into bore 24, and more specifically into region 10 of the subject 12. Receiver coil 30 is likewise incorporated into magnet 22, to detect or acquire MR data points or samples.

Referring further to FIG. 1, there is shown MR system 20 further comprising system electronics 40, which include a computer 42 interactively coupled to an interface 44. Components of MR systems 20 further include gradient amplifiers 46, 48, and 50, which are each coupled to computer 42, through interface 44, and respectively energize the $G_x$, $G_y$, and $G_z$ gradient coils 32, 24, and 36. Thus computer 42, through gradient amplifiers 46 and 48, drives the $G_x$ and $G_y$ gradient coils to generate an oscillating read gradient which comprises the combined effects of gradient waveforms $G_x$ and $G_y$ after time TE (echo time), to perform spiral scanning. Spiral scanning is determined by a spiral trajectory in k-space, and will be discussed in more detail with reference to FIGS. 2–10. To initiate a spiral scanning sequence, an operator (not shown), through interface 44, enters spiral pulse sequence parameters such as, for example, number of points, arms, and field of view (FOV). As is well-known, spiral parameters are selected depending on the image requirements such as, for example, resolution. The trajectory samples data in k-space, then the data samples are transformed by Fourier transform to constitute MR image data samples. System electronics 40 further include an RF power amplifier 52, coupled to energize RF excitation coil 28 to produce the RF pulse, and receive amplifier 54, which amplifies respective MR data samples detected by receiver coil 30, and couples them to computer 42.

As is also well known, a single coil can be substituted for RF excitation coil 28 and receiver coil 30. In such modification, a switching mechanism (not shown) is provided to alternately couple excitation amplifier 52 and receive amplifier 54 to such single coil. It is to be understood that system electronics 40 is likely to include other components that are not shown for the purpose of simplification.

Computer 42 is coupled to interface 44 to receive operator-defined spiral scanning parameters and generate a spiral trajectory for spiral scanning. Computer 42 is also configured to display the image, operator specified parameters if desired, and an indication of the resolution of the image. As used herein, "adapted to", "configured" and the like refer to computational devices (such as programmable computing devices and application specific integrated circuits, or the like), that are programmed with algorithms to provided a desired computation processing of signals applied to the device. The image data is acquired by sampling data at sample point locations along the spiral trajectory. Upon completion of data acquisition, computer 42 is configured to selectively process (including transformation by Fourier transform) the acquired MR image data samples, to generate an image of structure 14, as viewed in the section or slice 16.

Figure 2:
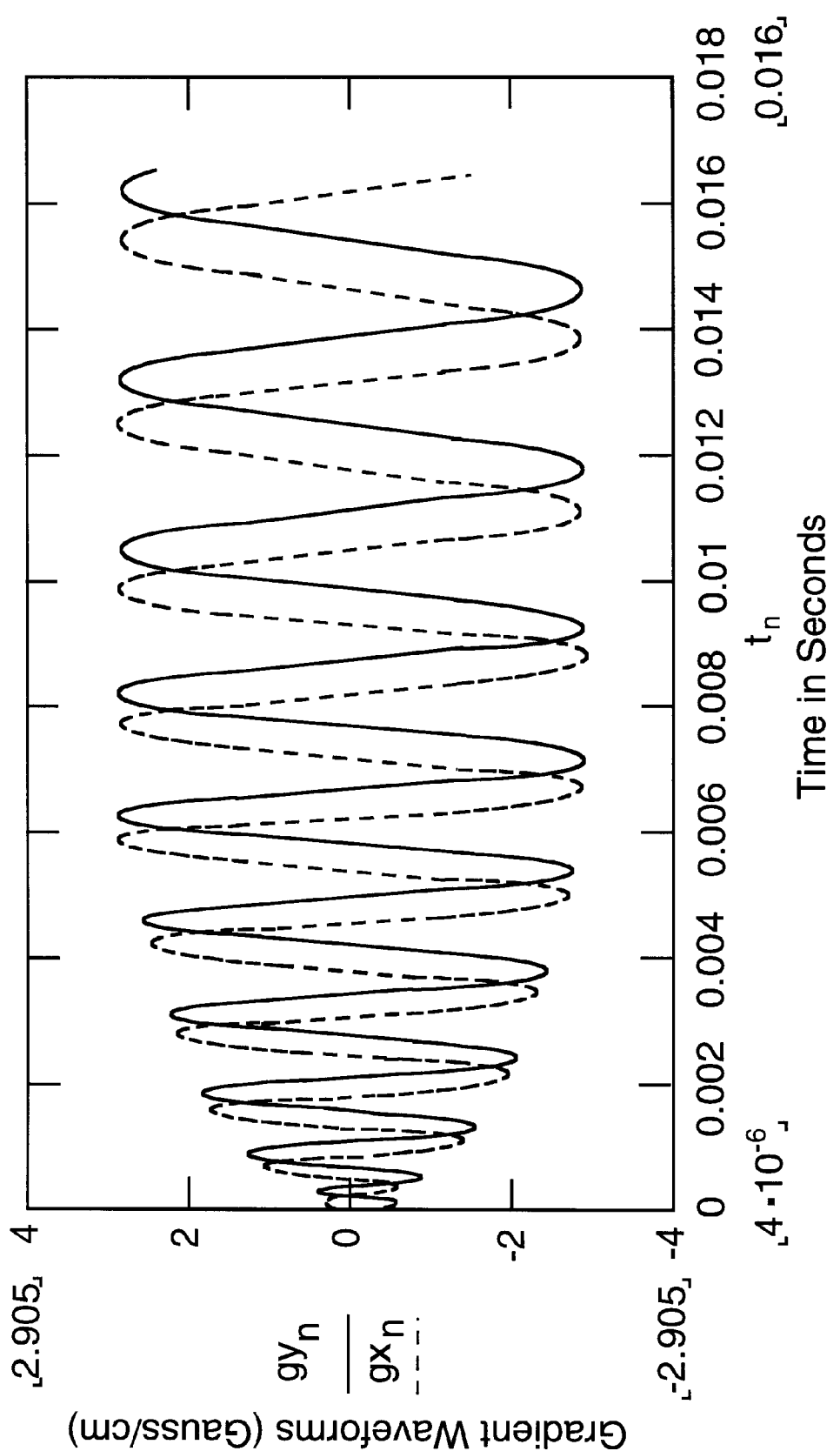
FIG. 2 shows a generalized set of gradient waveforms for an MRI scan sequence.

Referring to FIG. 2, there is shown gradient waveforms $G_x$ and $G_y$, comprising a waveform set for an MRI scan sequence, varying as a function of time. The gradient waveforms are generated in a well-known manner, as discussed with reference to FIG. 1, such that the integral of the gradient area in the respective x and y directions corresponds to the k-space position in the $k_x$ and $k_y$ directions. The amplitude of each gradient waveform in time is respectively chosen so they (the $G_x$ and $G_y$ waveforms) combine to generate a spiral trajectory in k-space.

A general spiral trajectory is of the form $k=r \exp(i\theta)$, where k is the complex position in k-space, $k=k_x+ik_y$; and r is the radius $r=[k_x+k_y]^{1/2}$ related to the angle $\theta$. The angle $\theta$ represents the rotation angle of the trajectory. Another characteristic of the spiral trajectory is the trajectory acceleration is composed of a tangential component and a normal centripetal component related to curvature. Curvature of the k-space trajectory represents the change of angle with respect to arc length. The sampling of the trajectory at constant maximum slew rate S is estimated for the general spiral trajectory by numerically integrating two coupled first order equations for the change in angle and gradient magnitude with time. Equations are known for the general spiral trajectory, and numerical integration methods are known, though computationally complex, to calculate the trajectory. Slew rate and gradient magnitude are limited by the imaging system or device parameters.

Figure 3:
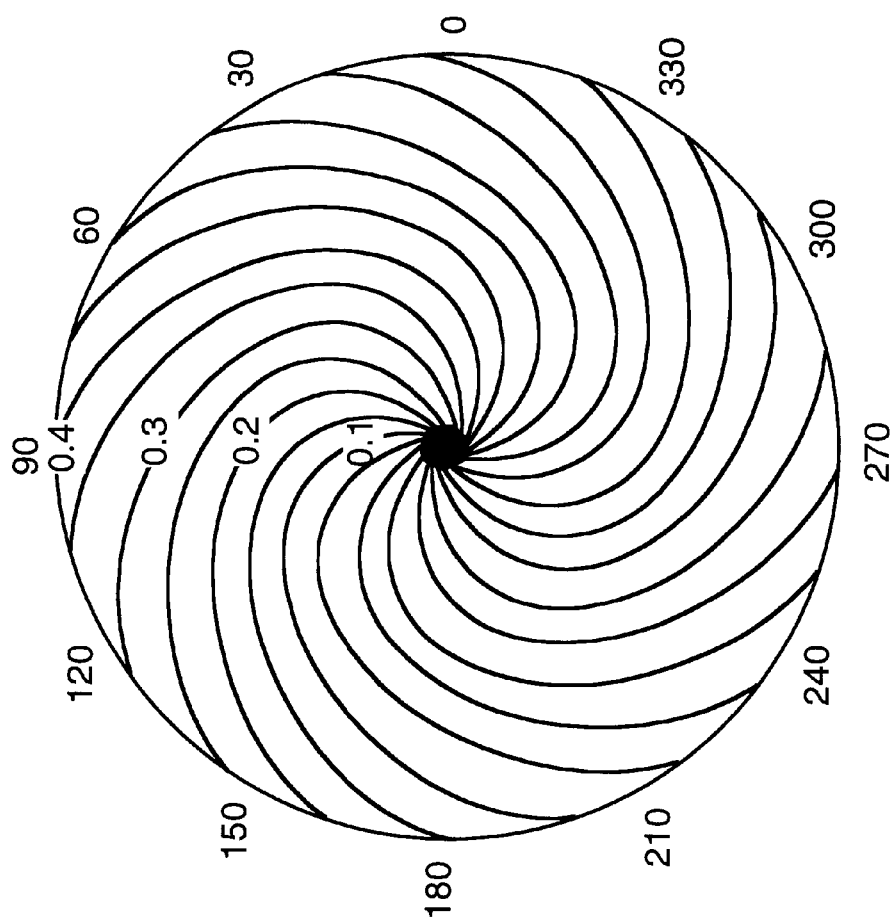
FIG. 3 shows a spiral of constant pitch to which preferred embodiments of the present invention are applicable.

A spiral of constant pitch, or an Archimedian spiral, is a simplified spiral trajectory for sampling k-space. A spiral of constant pitch is derived by selecting a constant value for pitch of the general spiral trajectory. A constant pitch spiral is defined by $k=A\theta \exp(i\theta)$, where the constant A is related to the number of spiral arms M and the image field of view D by $A=M/2\pi D$. FIG. 3 shows a spiral with constant pitch with 20 arms showing the central region of k-space, 16 pixels in diameter from a 256 size matrix.

The gradient magnitude G is proportional to the velocity in k-space, and slew rate magnitude S is proportional to the acceleration magnitude in k-space. Selecting a set of sampling points along a spiral trajectory of constant pitch is further simplified by using the known slew rate and gradient magnitude limitations corresponding to limitations imposed by the MR system.

The spiral trajectory in k-space is limited by both the maximum gradient magnitude $G_m$ and slew rate $S_m$, in accordance with capabilities of and limitations imposed by the MR imaging system.

Figure 4:
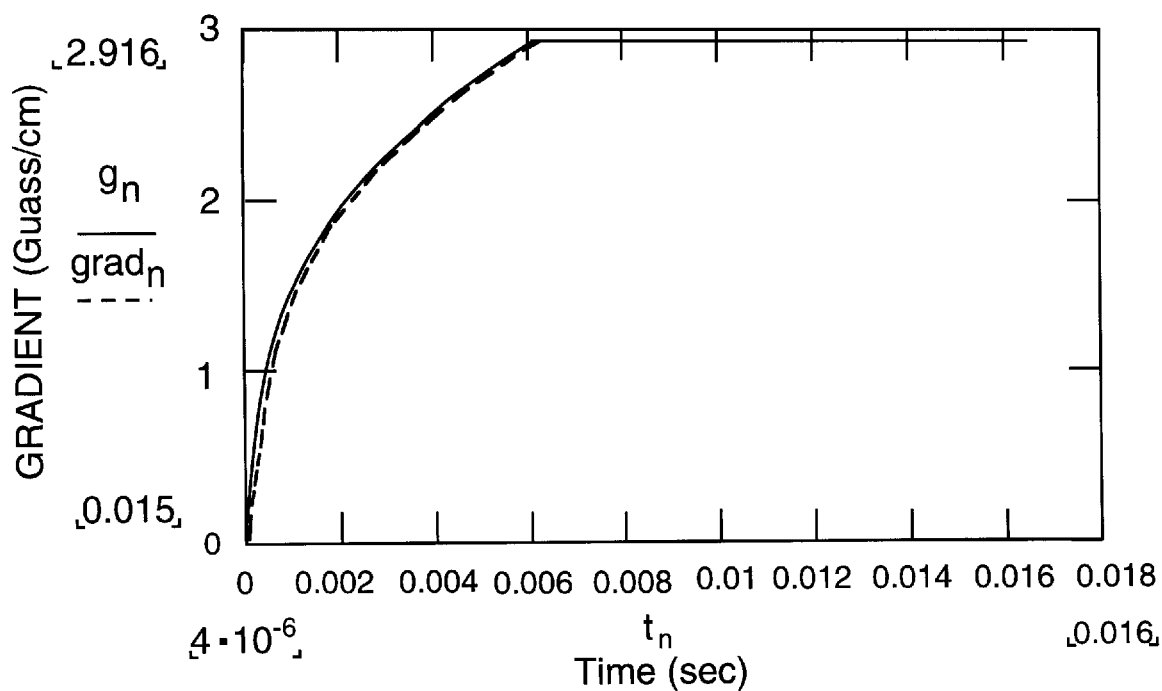
FIG. 4 graphically illustrates a representative slew rate for a spiral trajectory of constant pitch.
Figure 5:
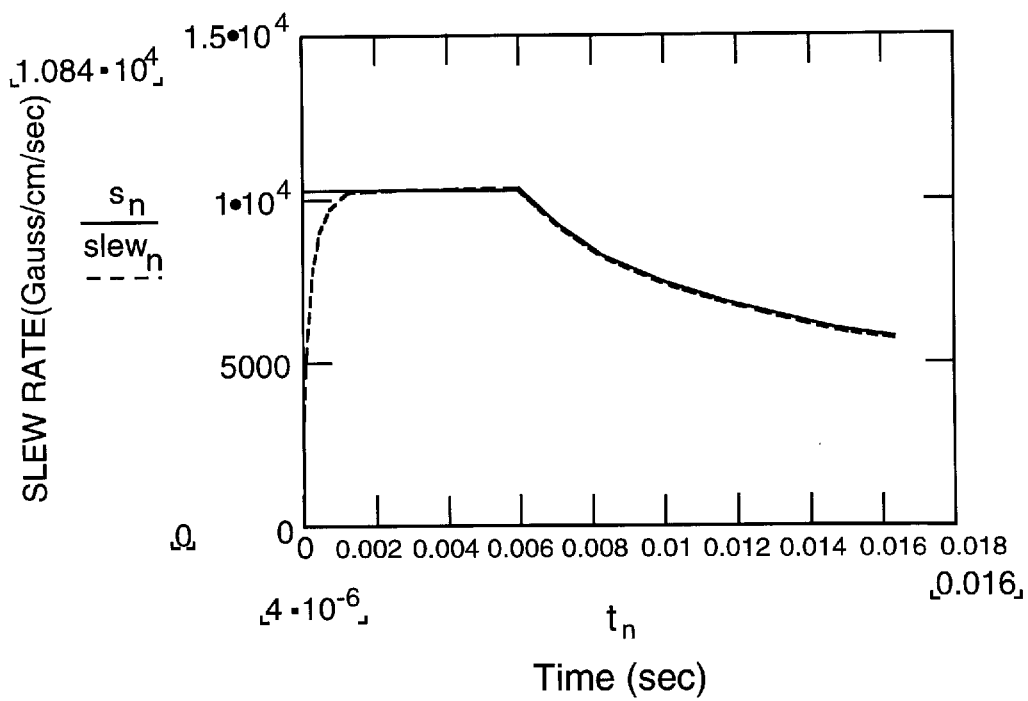
FIG. 5 graphically illustrates a representative gradient magnitude for a spiral trajectory of constant pitch.

Referring to FIGS. 4 and 5, a representative illustration of gradient magnitude and slew rate is shown for a spiral trajectory at constant pitch. Numerical integration methods, depicted as a solid line in FIGS. 4 and 5, derive values for gradient and slew rate, as a function of time.

In an embodiment of the invention, a computationally efficient method for calculating a spiral trajectory uses an analytical approximation for a constant pitch spiral relating the angle of the spiral trajectory to time. Efficiency is a measure of the number and complexity of calculations needed to be performed by a device, for example computer 42, to calculate a spiral trajectory. The number and complexity of calculations impact the amount of time needed to calculate a spiral scanning sequence. A more complex and demanding calculation will take more time than a less complex and demanding calculation. The analytical approximation does not require computationally demanding numerical integration. The analytical approximated spiral is calculated given the maximum slew rate and gradient magnitude, in accordance with the MR system capabilities. It is determinable that the slew rate is a constant value at the extreme angles along the trajectory. At rim of the trajectory (large angles $\theta>>1$), the slew rate magnitude is substantially smaller, $S_m=(A/\gamma)\theta(d\theta/dt)^2$, while at the origin (small angles $\theta<<1$) the slew rate is substantially larger, $S_m=(A/\gamma)(d^2\theta/dt^2)$, where $\gamma$ is the gyromagnetic ratio (4257 Hz/gauss).

Knowing the values for slew rate enables a determination for gradient magnitude, in accordance with the relationship between slew rate and gradient magnitude in MR systems. For an image field of view D, image size N, number of spiral arms M, the spiral pitch ($A=M/2\pi D$) covers each pixel in k-space provided the arms and the sample points along the arms are dense enough, as determined in accordance with the desired resolution of the image, which determines the maximum gradient $G_m=1/(\gamma D\, dt)$, where dt is the time between samples. The density of sample points is a consideration of MR systems using spiral scanning sequences, and is controlled by, for example, operator-defined parameters when initiating the scanning sequence. The density of sample points from a spiral sequence must be sufficient in quantity to correspond to grid points on a corresponding raster grid to form a resultant raster image. The maximum gradient is estimated by setting the distance between adjacent points on the trajectory in k-space near the rim to have a spacing between arms (1/D) to be given by $G=1/(\gamma dt D)$. The trajectory starts at constant slew rate S until the gradient equals G and then proceeds at constant gradient. The analytically derived gradient magnitude and slew rate are shown as dotted lines in FIGS. 4 and 5, respectively, and closely track the gradient and slew rate calculated by numerical integration methods.

An analytic approximation for a spiral trajectory is calculated mathematically using the values for gradient and constant slew rate determined above for extreme angles of the trajectory and is in the form:

$$\theta = at^2/(2+(bt)^{4/3}+2(bt)^{1/3}), \text{ where } a=\gamma S/A \text{ and } b=(2a/3)^{1/2}.$$

This analytic approximation relates $\theta$ to time for a spiral trajectory of constant pitch based on the system capabilities and limitations for slew rate and gradient magnitude. Based on slew rate behavior at extreme angles along the trajectory, it is determinable that $\theta(t)=at^2/2$, at the beginning of the trajectory, and that $\theta(t)=at^{2/3}/b^{4/3}$, at the end of the trajectory (away from the center of k-space). In order to avoid overshoot, the condition where the slew rate exceeds the limitations imposed by the MR system, and to enable smooth transition of the trajectory from the center, an additional non-linear term is added to the analytic approximation equation.

Figure 6:
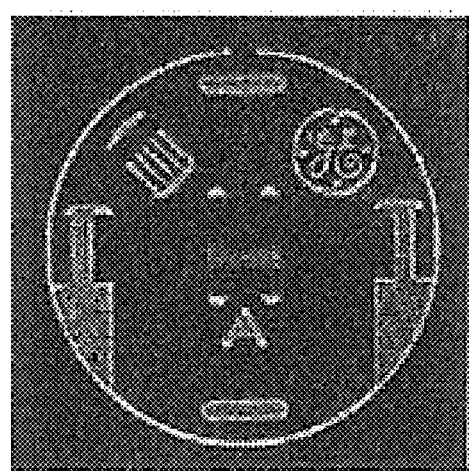
FIGS. 6 and 7 illustrate the resultant images scanned in accordance with known methods and preferred embodiments of the present invention, respectively.
Figure 7:
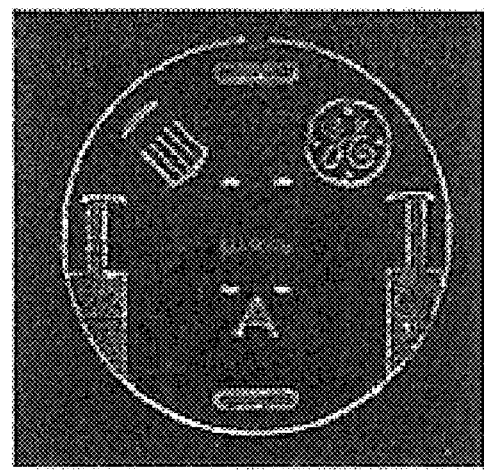

Advantageously, the approximations for $\theta$ and t may be rapidly calculated to optimize the spiral acquisition for a given field of view and image resolution. In a representative example, a spiral scanning sequence using the analytic approximation according to the invention was compared to the numerical integration method. For the analytic approximation of a spiral trajectory of constant pitch using the parameters M=22, d=20 cm, $S_m$=15000 Gauss/cm/s, dt=4× $10^{-6}$ sec, $G_m$=2.9 Gauss/cm and the number of samples per arm=4096, the time to calculate and download the trajectories was 10 seconds. The numerical method, using the same parameters, took approximately 21 seconds. FIG. 6 illustrates a resultant image scanned in accordance with a spiral trajectory calculated analytically, in comparison with FIG. 7 in which an image is scanned with a spiral trajectory calculated by numerical integration As is illustrated by FIGS. 6 and 7, the resolution is not affected by the more efficient analytic approximation of a spiral trajectory.

The ability to rapidly calculate spiral trajectory calculations has further advantages in practice. The analytic approximated trajectory is computationally less demanding and simpler to implement when compared to the known numerical integration of a second order differential equation. Further, referring again to FIG. 1, the analytical approximation can be readily updated when a system parameter (for example, pulse sequence parameters such as number of points, arms or FOV) is changed by the operator. It can be appreciated that an operator changes values that affect resolution, such as field of view (FOV), bandwidth, readout points or arms. The analytic approximated trajectory calculation enables the system to update more quickly than the computationally complex numerical integration method. Therefore, in a further embodiment, computer 42 and interface 44 are configured to receive operator-defined scan parameters to analytically calculate the spiral trajectory. Additionally, computer 42 and interface 44 are configured to display scan parameters and resolution calculations, for example with a display field on interface 44, for viewing by the operator.

Spiral trajectories have geometries other than constant pitch, for example variable pitch spirals, that are effective particularly near the outer edges or rim of k-space. Variable pitch spirals, such as logarithmic spirals are effective for reducing artifacts by over sampling at the origin of k-space and under sampling away from the origin. Logarithmic spirals have been used to explain the growth of the chambered nautilus and have a self similar property where the rate of growth at a constant angular rotation is proportional to the distance from the origin. The logarithmic spiral arm spacing increases linearly with the radius r. A problem with the logarithmic spiral is the high curvature near the center of k-space causing an undesirable amount of time, compared to constant pitch spirals, to traverse k-space.

Figure 8:
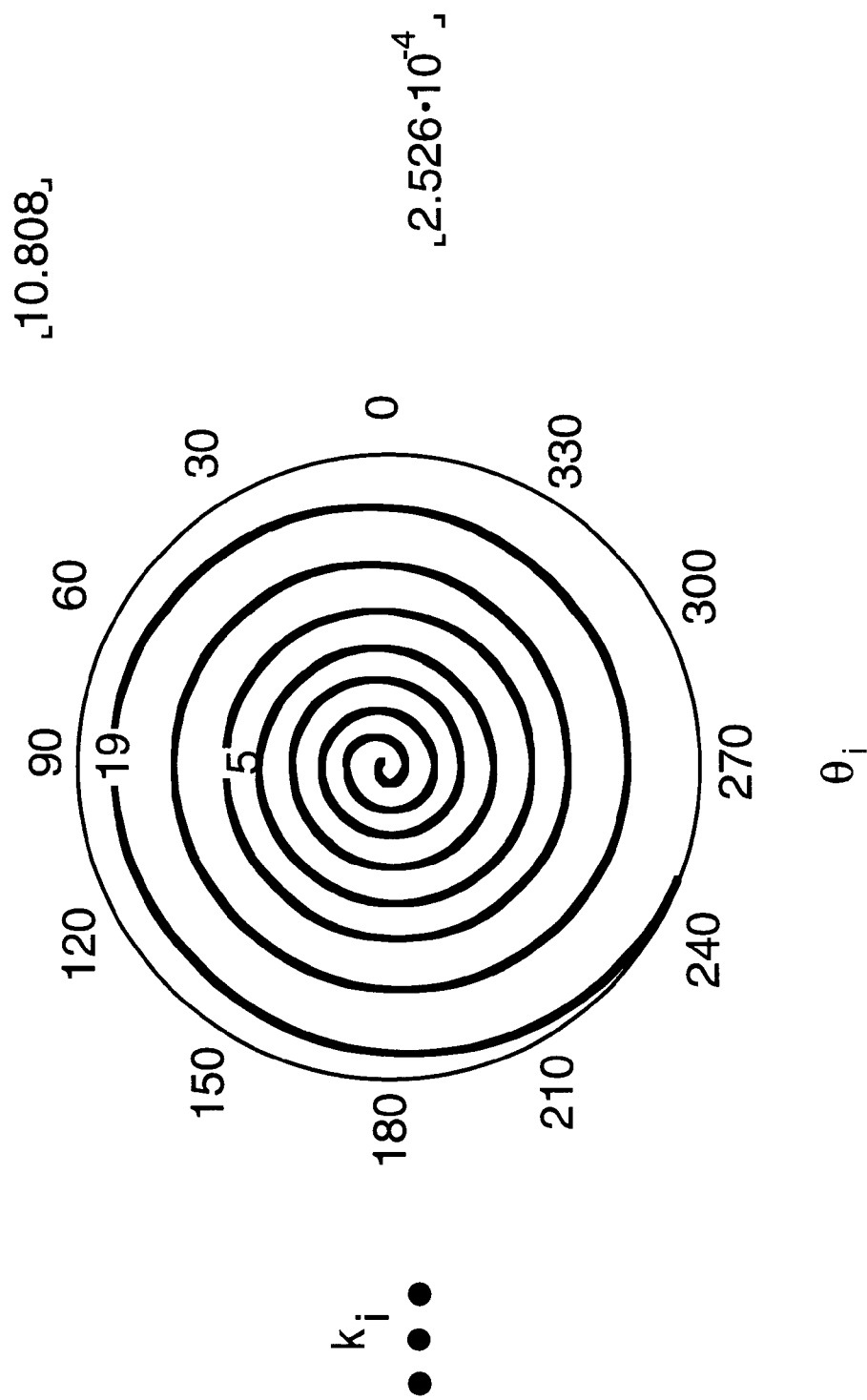
FIG. 8 shows a composite spiral to which preferred embodiments of the present invention are applicable.

In a further embodiment of the invention, a computationally efficient method for calculating a spiral trajectory includes a constant pitch spiral (first portion) used near the center of k-space, and a logarithmic spiral (second portion), coupled to the constant pitch spiral. A composite spiral with a constant pitch in the center followed by a logarithmic spiral is shown in FIG. 8.

The gradient $G_m$ is used to limit the sampling of the Archimedian region; however, in the logarithmic region the gradient may increase until limited by the maximum instrument gradient since the data is under sampled in this region.

The Archimedean spiral of constant pitch is over sampled near the origin of k-space for two reasons. The constraint of constant slew rate requires the sample points to be more closely spaced near the origin and the spacing between the interleaved spiral arms decreases to zero at the origin. Alternatively, varying the spiral pitch creates a more efficient trajectory. Also, resolution improves near the rim of the trajectory.

Figure 9:
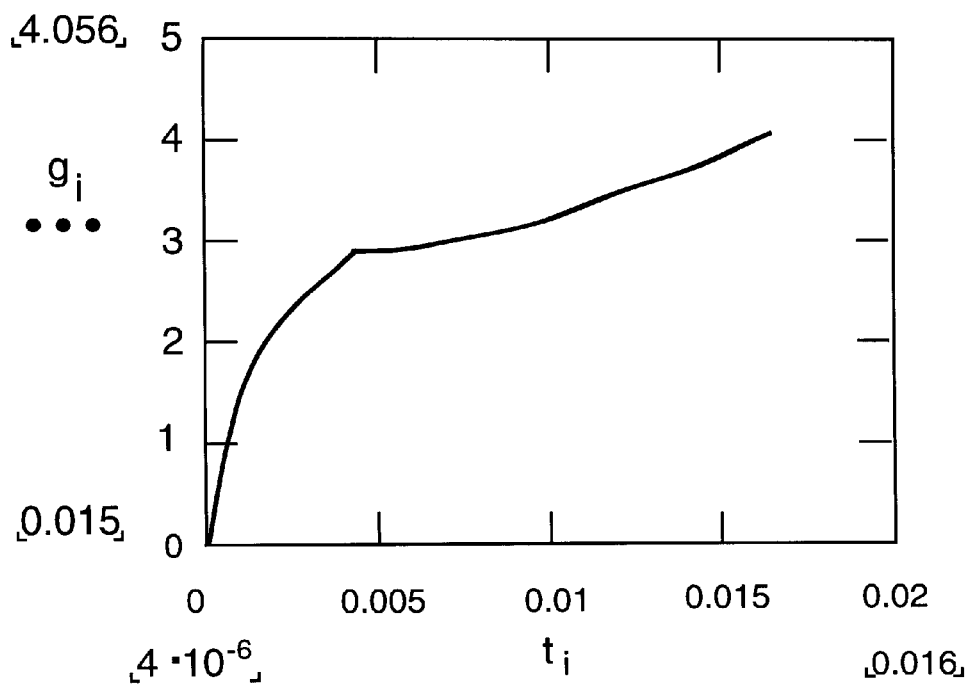
FIG. 9 graphically illustrates a representative slew rate for a logarithmic spiral.
Figure 10:
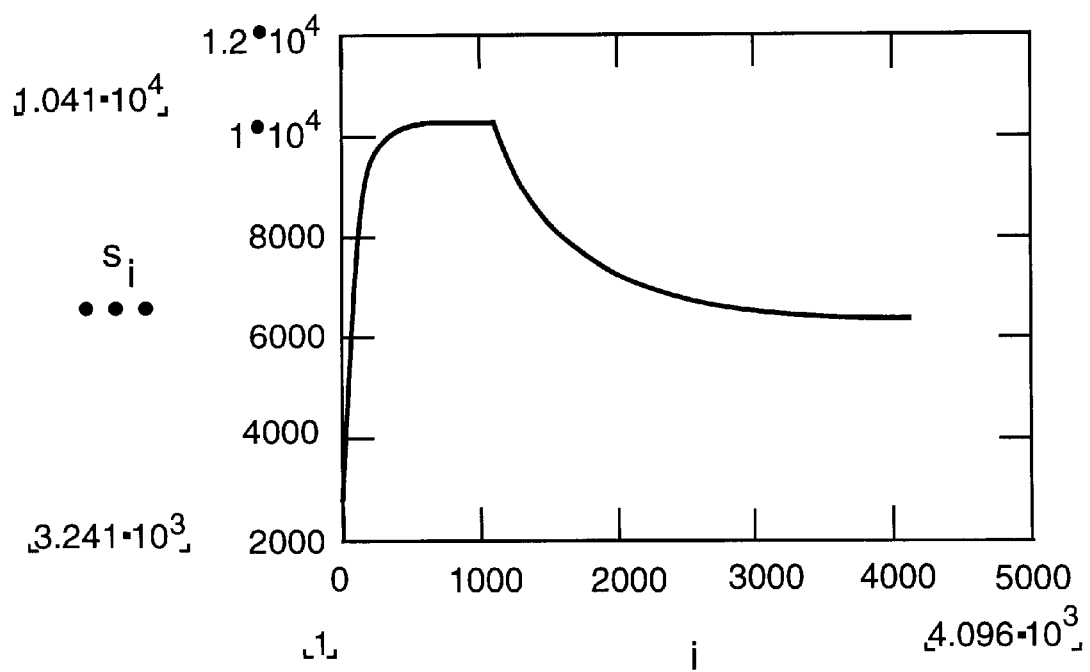
FIG. 10 graphically illustrates a representative gradient magnitude for a logarithmic spiral; and, FIGS. 11 and 12 illustrate resultant images scanned in accordance with known methods and preferred embodiments of the present invention, respectively.

Referring again to FIG. 8, a spiral of constant pitch, calculated analytically as described with reference to FIGS. 2-7, is modified after an arbitrary angle $\theta_1$ by a logarithmic trajectory $r=A\theta_1 \exp(\theta/\theta_{1-1})$ to improve the resolution by increasing the inter-arm spacing of the spiral. The angle $\theta_1$ is chosen at half the acquisition time of the spiral. There may be different values for angle $\theta_1$ depending on the imaging requirements. It can be appreciated that acquisition time is determined by the operator-defined parameters and MR imaging system capabilities. Bandwidth and number of points in a spiral arm, for example, are factors considered by the operator during the set up of the scan and scanning parameters. Image quality is affected by changes in the parameters of bandwidth and number of points, and both parameters are generally changed experimentally by the operator to achieve the desired image quality. It also can be appreciated that $\theta_1$ is selected in accordance with resolution needs. By selecting angle $\theta_1$ to occur at half the acquisition time, the composite spiral is critically sampled in the first half of the acquisition and under sampled during the second half. Advantageously, the logarithmic portion of the composite spiral goes out further in k-space to yield higher resolution. The composite logarithmic spiral trajectory may be estimated using the analytic formula in both regions (constant and logarithmic). FIGS. 9 and 10 graphically illustrate gradient and slew rates for a composite spiral, respectively.

Referring again to FIG. 1, computer 42 is configured to generate a spiral trajectory by analytic approximation to form either of a spiral trajectory of constant pitch or variable pitch, or to form of a composite spiral trajectory consisting of constant and variable pitch, as described with reference to FIGS. 2–12.

Figure 11:
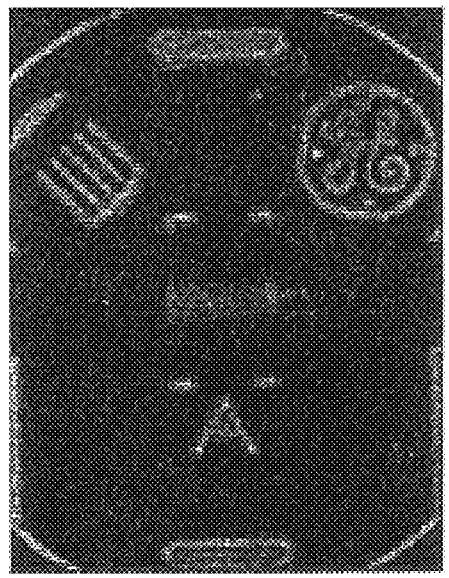
Figure 12:
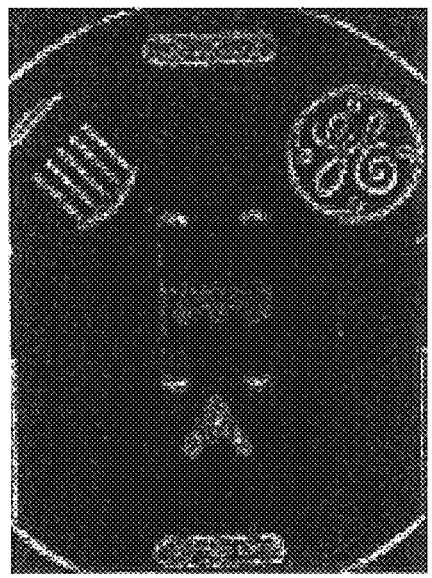

Designing variable pitch spiral scanning sequences with an analytic approximation simplifies the scan sequence by providing a more computationally efficient means of estimating the trajectory outcome. For example, the image resolution for a trajectory limited by acquisition time, gradient strength, gradient slew rate and receive bandwidth is determined. Advantageously, the analytic approximation enables the system to update rapidly and enables a display of the image resolution. Further, the logarithmic spiral sequence near the rim of k-space permits greater resolution. FIGS. 11–12 illustrate the resultant images scanned by numerical methods and a composite spiral trajectory, respectfully. Resolution is visibly improved using the composite spiral, as shown in FIG. 12.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A computationally efficient method for calculating a spiral scanning trajectory for magnetic resonance imaging (MRI) comprising the steps of:
    a) placing an object to be imaged in a magnetic field;
    b) exciting nuclei in the object to excite desired spectral components for imaging;
    c) generating at least one composite spiral trajectory in k-space, said compositie spiral trajectory having a first portion of constant pitch and a second portion of variable pitch;
    d) applying respective time-varying gradients along two respective axes in accordance with the at least one spiral trajectory in k-space with the at least one composite spiral trajectory extending along a frequency axis in k-space;
    e) defining a set of sampling point locations along the at least one composite spiral trajectory;
    f) acquiring a data sample at the sample point locations; and
    g) processing the acquired data samples to construct an image of the object.

2. The method of claim 1 wherein the step of generating the at least one composite spiral trajectory includes determining slew rate and gradient magnitude corresponding to MRI system capability limitations.

3. The method of claim 1 wherein the step of generating the at least one composite spiral trajectory includes determining a slew rate magnitude along the at least one spiral trajectory at an origin of k-space and at a rim of k-space.

4. The method of claim 3 wherein the step of generating the at least one composite spiral trajectory further includes a non-linear term to prevent overshoot.

5. A computationally efficient method for calculating a spiral scanning trajectory for magnetic resonance imaging (MRI) comprising the steps of:
    a) placing an object to be imaged in a magnetic field;
    b) exciting nuclei in the object to excite desired spectral components for imaging;
    c) generating a first and a second portion of at least one spiral trajectory, the first portion forming a spiral of constant pitch, the second portion forming a spiral of variable pitch;
    d) applying respective time-varying gradients along two respective axes in accordance with the at least one spiral trajectory in k-space with the at least one spiral trajectory extending along a frequency axis in k-space;
    e) coupling the first and second portions to form a composite spiral trajectory,
    f) defining a set of sampling point locations along the composite spiral trajectory;
    g) acquiring a data sample at the sample point locations; and
    h) processing the acquired data samples to construct an image of the object.

6. The method of claim 5 wherein the second portion is a logarithmic spiral trajectory.

7. The method of claim 5 wherein the first portion and the second portion are coupled at an angle occurring at a time half way through an acquisition time for acquiring the data samples.

8. The method of claim 7 wherein the angle is selected according to resolution needs.

9. The method of claim 5 wherein the first portion is analytically approximated by estimating a slew rate and gradient magnitude based on MRI system limitations.

10. An apparatus for magnetic resonance imaging (MRI) by spiral trajectory scanning comprising:
    a MR imaging device for acquiring and processing data samples of an object to be imaged, the MR imaging device acquiring the data samples by spiral trajectory scanning, the MR imaging device having system-specified capabilities;
    an interface coupled to the MR imaging device for receiving operator-defined spiral scanning parameters; and,
    a computer coupled to the interface and the MR imaging device configured to generate a composite spiral trajectory in k-space in accordance with operator-defined spiral scanning parameters and system-specified capabilities, the spiral trajectory having a first portion of constant pitch and a second portion of variable pitch, said spiral trajectory being used by the MR imaging system to perform spiral trajectory scanning, the computer being configured to calculate and display resolution of the image based on the operator-defined spiral scanning parameters.

11. The apparatus of claim 10 wherein the interface further comprises a display field to enable an operator to view the calculated resolution and scanning parameters.

12. An apparatus for magnetic resonance imaging (MRI) by spiral trajectory scanning comprising:
    an MR imaging device for acquiring and processing data samples of an object to be imaged, the MR imaging device acquiring the data samples by spiral trajectory scanning;
    an interface coupled to the MR imaging device for receiving operator-defined spiral scanning parameters;
    a computer coupled to the interface and the MR imaging device configured to generate a composite spiral trajectory in k-space in accordance with operator-defined spiral scanning parameters, the composite spiral trajectory having a first portion of constant pitch and a second portion of variable pitch, the composite spiral being used by the MR imaging system to perform spiral trajectory scanning, the computer configured to process the acquired data samples to generate an image of the object; and,
    a display device coupled to the computer and the interface for displaying the image.

13. The apparatus of claim 12 wherein the computer is configured to calculate a resolution of the image acquired by spiral trajectory scanning and the display device displays the calculated resolution.

* * * * *